US006820718B2

(12) United States Patent
LaCarrubba

(10) Patent No.: US 6,820,718 B2
(45) Date of Patent: Nov. 23, 2004

(54) ACOUSTIC REPRODUCTION DEVICE WITH IMPROVED DIRECTIONAL CHARACTERISTICS

(76) Inventor: Emanuel LaCarrubba, 7 Villa Pl., Novato, CA (US) 94945

( * ) Notice: Subject to any disclaimer, the term of this patent is extended or adjusted under 35 U.S.C. 154(b) by 0 days.

(21) Appl. No.: 10/264,747

(22) Filed: Oct. 4, 2002

(65) Prior Publication Data

US 2004/0065500 A1 Apr. 8, 2004

(51) Int. Cl.[7] ........................... H05K 5/02; G10K 11/04

(52) U.S. Cl. ....................... 181/155; 181/176; 181/191; 381/160

(58) Field of Search ................................ 181/155, 176, 181/175, 143, 191; 381/352, 160, 391

(56) References Cited

U.S. PATENT DOCUMENTS 1,936,396 A * 11/1933 Jefferis ....................... 381/160
2,643,727 A * 6/1953 Leon .......................... 181/155
2,732,907 A * 1/1956 Leon .......................... 181/175
4,190,739 A * 2/1980 Torffield ..................... 181/155
4,629,030 A * 12/1986 Ferralli ....................... 181/155
4,836,329 A * 6/1989 Klayman ..................... 181/155
4,907,671 A * 3/1990 Wiley ......................... 181/155
5,144,670 A * 9/1992 Negishi ...................... 181/155
5,537,480 A * 7/1996 Boothroyd et al. .......... 381/160
5,615,176 A * 3/1997 LaCarrubba ................ 367/151
5,793,001 A * 8/1998 Ferralli ....................... 181/155
6,068,080 A * 5/2000 LaCarrubba ................ 181/155
6,435,301 B1 * 8/2002 LaCarrubba ................ 181/155

FOREIGN PATENT DOCUMENTS

GB 2273847 A * 6/1994 ............ H04R/1/34
JP 02291798 A * 12/1990 ............ H04R/1/34
JP 06197394 A * 7/1994 ............ H04R/1/34
WO WO 3065761 A1 * 8/2003 ............ H04R/5/02

* cited by examiner

*Primary Examiner*—Shih-Yung Hsieh
*Assistant Examiner*—Edgardo San Martin
(74) *Attorney, Agent, or Firm*—Vierra Magen Marcus; Harmon & DeNiro LLP

(57) ABSTRACT

A sound reproduction system is disclosed which minimizes unwanted acoustic reflections and the resulting comb-filter effects but which still maintains a broad and uniform directional characteristic throughout the region in the listening room in which listening positions are located.

23 Claims, 10 Drawing Sheets

ACOUSTIC REPRODUCTION DEVICE WITH IMPROVED DIRECTIONAL CHARACTERISTICS

TECHNICAL FIELD

The present invention relates to acoustic reproduction devices and more particularly to sound radiator systems comprising means for radiating acoustic energy to a given listening position or listening area within a listening room, such that undesired reflections experienced at the listening position and within the said listening area originating from for instance room boundaries or from specific surfaces of obstacles in the room can be either avoided altogether or at least attenuated in a controlled manner.

BACKGROUND OF THE INVENTION

In designing loudspeakers and systems of loudspeakers both for domestic and professional use, one important acoustical characteristic of such systems is the directivity of radiation of acoustic energy to the surroundings. Generally sound is not only radiated directly towards the listening position in the listening room but also towards the various boundaries of the room and towards different objects present in the room. When sound impinges on such boundaries at least a part of the acoustic energy is reflected from the boundary and some of these reflections eventually reach the listening position or listening area together with the sound energy received directly from the loudspeaker. Whereas some of this reflected acoustic energy contributes in a positive sense to the overall sound perception at the listening position, other reflections have been found to be generally problematic, leading for instance to undesired comb-filter effects that affect the timbre of the sound negatively. It has specifically been found that reflections from the portions of the floor and ceiling between the loudspeaker and the listening position are generally undesirable, and that they should at least be suitably attenuated as compared to the direct sound from the loudspeaker. Also reflections from a wall or other spacially extended obstacle behind the loudspeaker will often lead to the above mentioned undesirable comb-filter effects.

It has furthermore been recognized that there should be a balance between the sound received at the listening position directly from the loudspeaker and the reverberant sound, i.e. the sound caused by reflections. In a typical loudspeaker set-up in a listening room the level of the direct sound and of the reverberant sound are on the same order of magnitude. If the above mentioned undesirable effects of some of the reflections in the room were not taken into consideration, a uniform radiation from the loudspeaker in all directions should thus be aimed at. It is however apparent from the above that a suitable compromise between this omnidirectional radiation of sound energy and attenuation of radiation in some directions must be considered, for instance by tailoring the directivity of the loudspeaker—or of the different loudspeaker units (treble unit, mid-frequency unit, etc.) in loudspeaker systems comprising more than one radiating unit.

Means of tailoring the directivity of loudspeakers are numerous within the art of electroacoustics and have been described regularly at least since the 1930's. Such means have generally comprised various forms of acrostic lenses or either plane or curved reflector surfaces placed in front of a loudspeaker driver diaphragm. See, for example, U.S. Pat. No. 5,615,176, U.S. Pat. No. 6,068,080 and U.S. Pat. No. 6,435,301, each to the present inventor. See, also, U.S. Pat. No. 4,836,329 to Klayman and UK Patent No. 830,745 to Quennell. Each of these references are incorporated by reference in their entirety herein.

SUMMARY OF THE INVENTION

Based on the above background it is an advantage of the present invention to provide a sound reproduction system which does not suffer from the above mentioned drawbacks relating to unwanted reflections and the resulting comb-filter effects but which on the other hand still maintains a broad and uniform directional characteristic throughout the region in the listening room in which listening positions are located.

Specifically the device according to embodiments of the invention should provide attenuation of typical reflections from the floor and ceiling between the device and the listening position and of the reflections from boundaries or obstacles behind the device.

The acoustic requirements of such a device can be broadly reformulated by requiring that the device must minimize the reflected sound from those surfaces (i.e. room boundaries or surfaces of obstacles in the room, the dimensions of which are large enough compared with the wavelength of the radiated sound to cause appreciable reflections) that result in essentially the same interaural difference of the reflected sound from that particular surface and of the sound received directly from the device. Those reflections that fulfill the above requirement are the reflections which are most likely to give rise to the above mentioned undesired comb-filter effects.

The above requirement is illustrated in FIGS. 1*a* and 1*b*. Thus FIG. 1*a* shows a horizontal cross-section through a listening room, a sound source (for instance the device according to the invention) and a listener placed in front of the sound source. The sound received directly from the source at the two ears of the listener is indicated by the arrows D whereas sound reflected from the left wall of the room is indicated by R. The interaural difference (both time and intensity differences as a function of frequency) of the direct sound D is close to zero at all frequencies whereas the interaural difference of the reflected sound R is substantially different from zero. The corresponding interaural time difference will be different from zero at all frequencies whereas the interaural intensity difference will tend to increase with frequency. Reflections of this kind are not attenuated by the device according to the invention as defined by the above requirement.

Referring now to FIG. 1B, there is shown a vertical cross-section through the listening room and the sound source and listener are shown together with the direct sound D. The reflections from the floor, $R_f$, from the ceiling, $R_c$, and from the wall behind the sound source, $R_b$, are also shown. The interaural differences of each of the above three reflections will be approximately equal to the interaural difference of the direct sound, i.e. in this specific case approximately equal to zero.

According to embodiments of the invention, the above requirements based on the interaural differences are fulfilled by providing a sound reproduction device having a substantially uniform directivity in the horizontal plane through the device in front of the device from approximately −90 degrees azimuth angle to +90 degrees azimuth angle, a substantial attenuation of the directivity in the horizontal plane through the device at the back of the device from approximately +90 degrees azimuth through 180 degrees azimuth to approximately −90 degrees azimuth, and a directivity in the vertical plane through the device which exhibits attenuation in those directions of sound radiation which are likely to give rise to said undesired reflections from the floor and the ceiling. Various examples of measurements carried out on a specific embodiment of a reproduction device according to the invention are shown in FIGS. 5A through 5D and in FIGS. 6A through 6D.

According to the invention there is thus provided a sound reproduction device having a directivity which can be tailored according to the above requirements and, if necessary, to further requirements of a specific listening room. Embodiments of the device according to the invention thus include:

one or more generators of sound energy for delivering sound energy to the listening position(s) or a listening area in a room, and means for directing portions of said sound energy from said one or more generators to said listening position (s)/listening region, where said means for directing sound energy are adapted for minimizing the reflected sound from each of one or more surfaces that results in essentially the same interaural difference of the reflected sound and of the sound received directly from said means for directing sound energy.

One example of such means for directing sound would be acoustic lenses or reflectors of various kinds and the embodiment of the invention described in the detailed description of the invention is in fact based on a further development of an acoustic reflector disclosed in U.S. Pat. No. 5,615,176 and U.S. Pat. No. 6,068,080. It is however understood, that other kinds of acoustic reflectors or lenses or alternatively arrays of a plurality of sound sources could also be used to carry out the above inventive principle without thereby departing from the invention as defined in the appended claims.

According to embodiments of the invention, a plurality of means for directing sound may be used in a single reproduction device according to the invention. In order to optimize such means according to the specific wavelengths of sound to be handled by that specific means, the overall dimensions thereof, and possibly also other pertinent acoustic parameters such as shape and placement of reflective surfaces, surface structure of various surfaces and placement of acoustic attenuation material etc., it is in principle advantageous to apply more than one of such means and optimize the individual characteristics thereof. This provides for the further possibility if desired to use different directional characteristics of the different means, for instance—in case of acoustic reflectors—to apply different orientations of these relative to the surroundings. It could also well be beneficial to utilize different kinds of acoustic generators in the different means, for instance according to different requirements relating to the radiated frequency ranges and the radiated acoustic power in each different frequency range.

It is also possible to combine the sound reproduction device according to the invention, which hence fulfills the above requirements relating to interaural differences, with other sound reproduction devices that are not designed to meet these requirements. For instance a combination of the device according to the invention—mainly intended for reproduction of higher frequencies, for instance above 500 Hz—with an essentially omnidirectional device for low frequency reproduction could in practice be utilized to advantage.

BRIEF DESCRIPTION OF THE DRAWINGS

Embodiments of the sound reproduction device according to the invention will now be described in more detail with reference to the accompanying drawings, in which.

DETAILED DESCRIPTION OF THE INVENTION

In the following a detailed description of various embodiments of the invention is given.

Figure 1A:
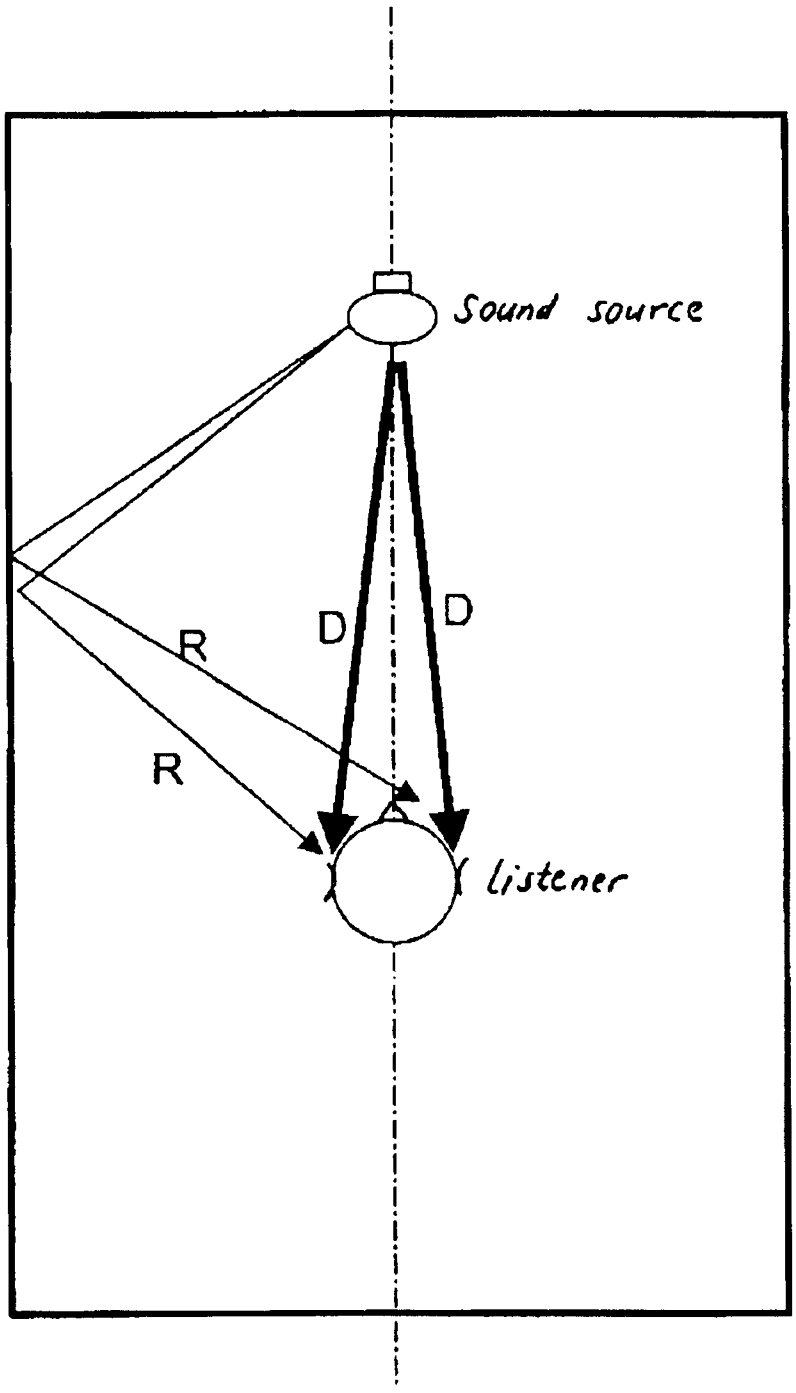
FIG. 1A is a schematic representation of a sound source and listener in a listening room with direct sound and reflections indicated, shown in a horizontal plan through the sound source and the listeners head.
Figure 1B:
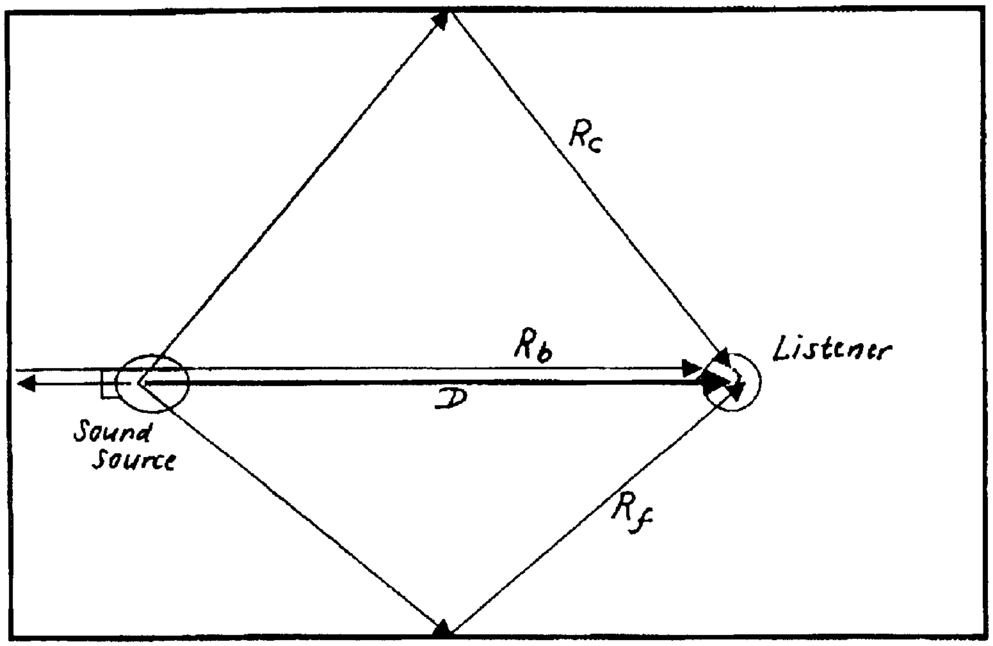
FIG. 1B is a schematic representation of a sound source and listener in a listening room with direct sound and reflections indicated, shown in a vertical plan through the sound source and the listeners head.
Figure 2:
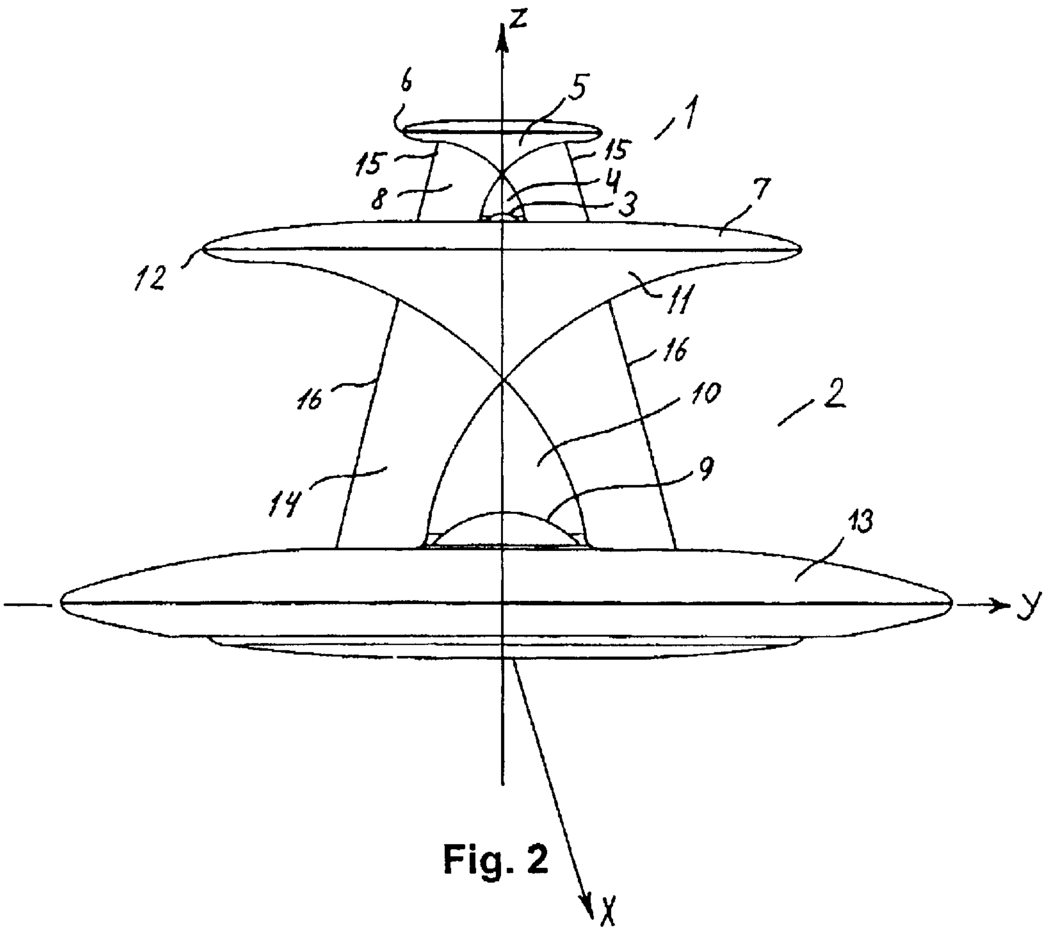
FIG. 2 is a schematic representation of a sound reproduction device according to the invention comprising two acoustic reflectors placed on top of each other.

With reference to FIG. 2 there is shown a sound reproduction device with a directional characteristic of radiated sound energy differing substantially and in a controllable manner from an omnidirectional characteristic. Specifically the device shown in FIG. 2 comprises two acoustic reflectors 1, 2 provided with individual sound generators 3, 9 and placed on top of each other. The radiators are dimensionally scaled according to the specific frequency ranges to be radiated by each of the two reflectors. The reflectors are shown as geometrically symmetric about the vertical XZ plane of the drawing, but it is understood, that reflectors with an asymmetric geometry could in principle also be conceived and that, even though the reflectors are substantially geometrically symmetric about the XZ plane, they may be provided with different acoustic surface materials of fine structure of the various reflecting surfaces in order to obtain desirable deviation from symmetric directional characteristics, for instance in order to meet certain specific requirements in the room, in which the device is actually used. A number of such possibilities will be mentioned in the following.

Furthermore it is possible to rotate the two reflectors 1, 2 relative to each other about the longitudinal (Z) axis. Although the directional characteristics of the two reflectors in most cases probably should be substantially identical—as seen from the surroundings—there might be circumstances where a certain attenuation of the radiation at large angles in the horizontal plane relative to the XZ plane of could be beneficial for instance due to the presence of strongly reflecting surfaces in this direction. If such reflections are predominantly present within one of the frequency ranges radiated by each of the two radiators it could well be beneficial to rotate one of the reflectors relative to the other reflector assuming that the latter radiates frequencies at which said reflections are not disturbing.

Returning to the specific structure of the reflectors 1 and 2, these structures are in principle similar apart from dimensional differences related to the specific frequency ranges (specific ranges of wavelengths) radiated by each individual radiator. The radiators 1, 2 mainly include first and second reflector surfaces 4, 10 and 5, 11 respectively for directing sound energy radiated by sound energy generators 3, 9 outwardly towards the desired listening positions or listening areas in the surrounding room. One specific example of such reflector surfaces is described in detail in U.S. Pat. Nos. 5,615,176 and 6,068,080, previously incorporated by reference, according to which the reflector surfaces are ellipsoidal. Each of the acoustic reflectors furthermore comprises first and second baffle means 7, 13 and 8, 14 respectively for controlled modification of the directional characteristics of the reflector surfaces 4, 10 and 5, 11 respectively. Specifically, the first baffle means according to this embodiment of the invention extends substantially normal to the longitudinal axis Z of the acoustic reflector at the end of said first reflector surface 4, 10 facing away from the second reflector surface 5, 11. The first baffle means is shown in FIG. 2 with an upper surface which is generally planar but provided with slightly rounded portions towards the outer edge of the baffle. Other forms of the surface of the first baffle 7, 13 could however also be conceived in practice.

Figure 3:
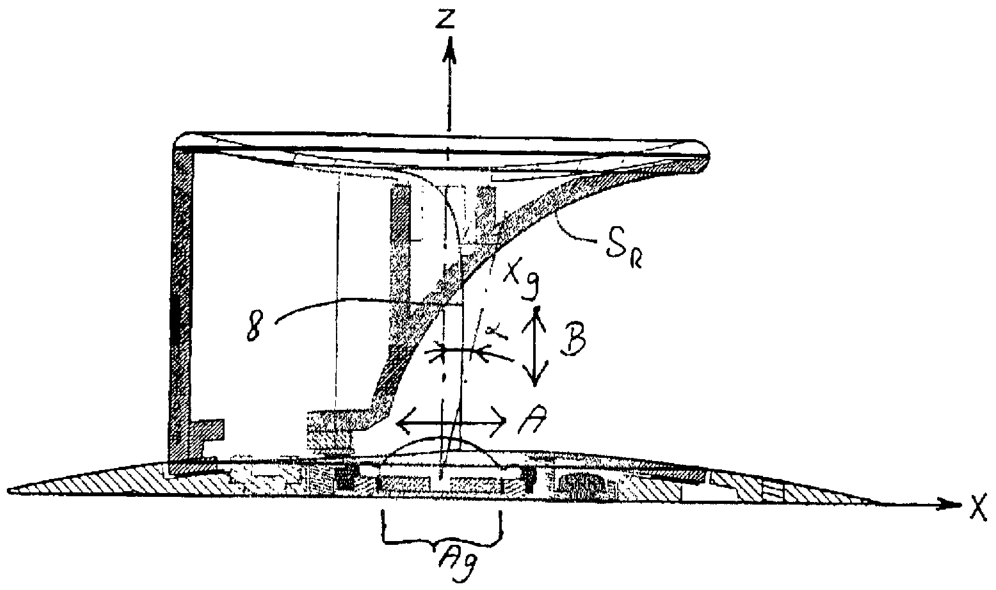
FIG. 3 is a schematic, cross-sectional representation of a single acoustic reflector system as used in the device according to the invention.
Figure 4:
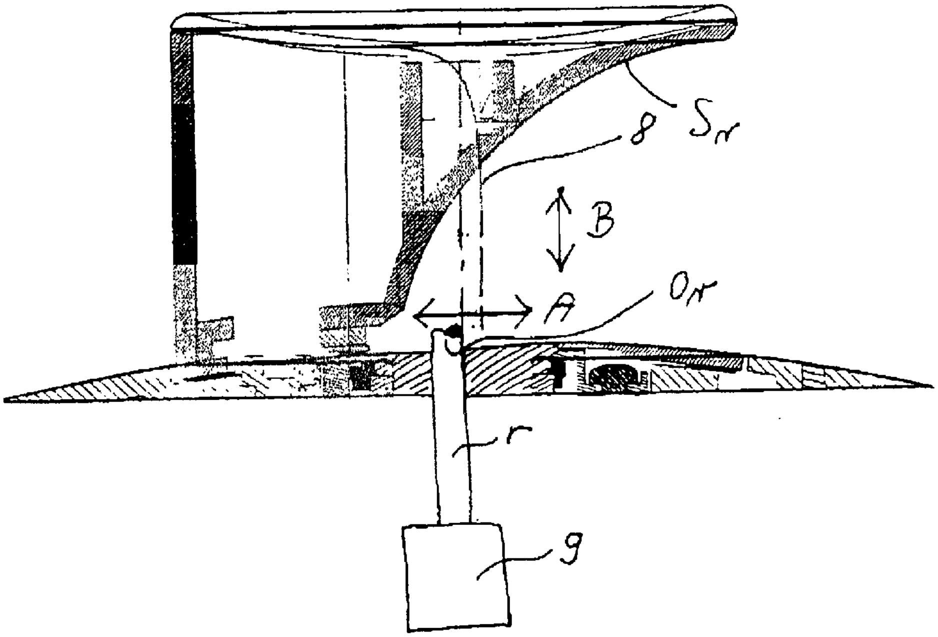
FIG. 4 is a schematic, cross-sectional representation of a single acoustic reflector corresponding to the one shown in FIG. 3 but provided with an alternative acoustic generator.
Figure 5A:
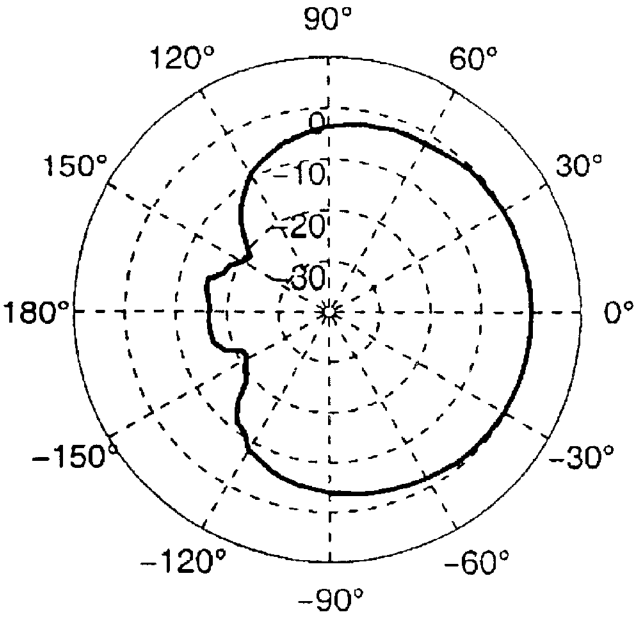
FIGS. 5A through 5D show measured free field horizontal directivities at the frequencies 2.5 kHz, 5 kHz, 10 kHz and 20 kHz of a sound reproduction device according to the invention normalized relative to the frontal direction (0 degrees)
Figure 5B:
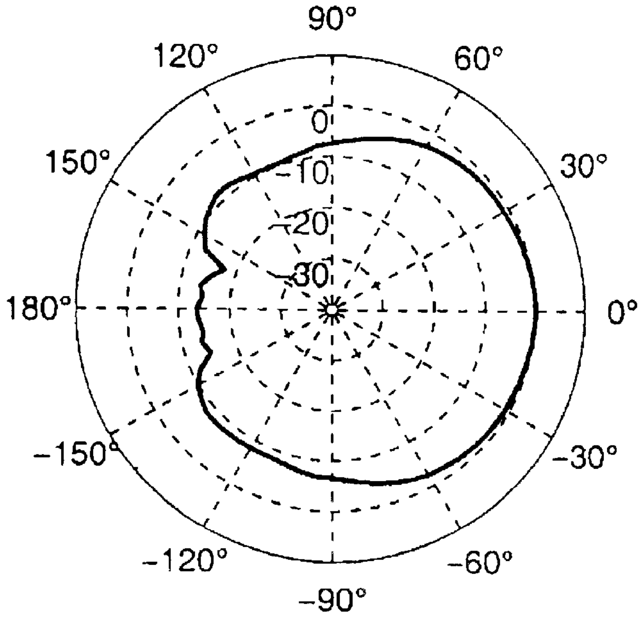
Figure 5C:
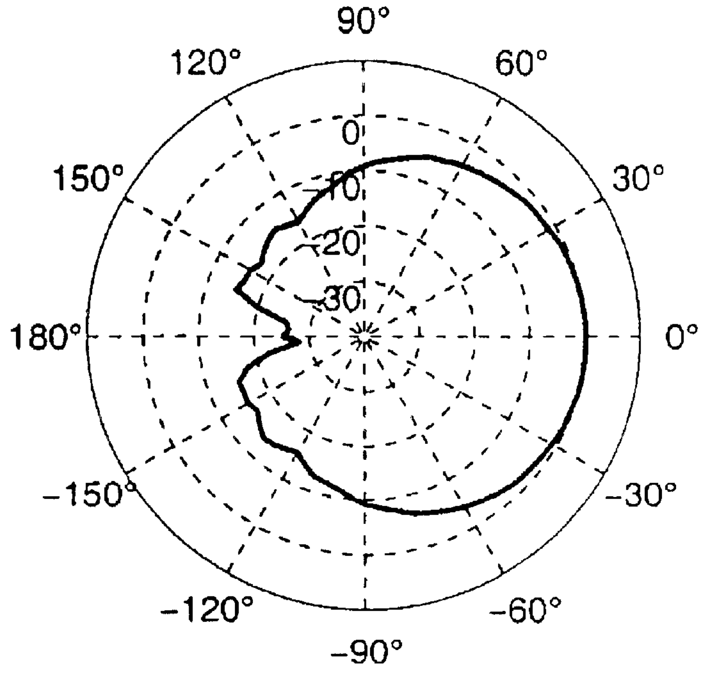
Figure 5D:
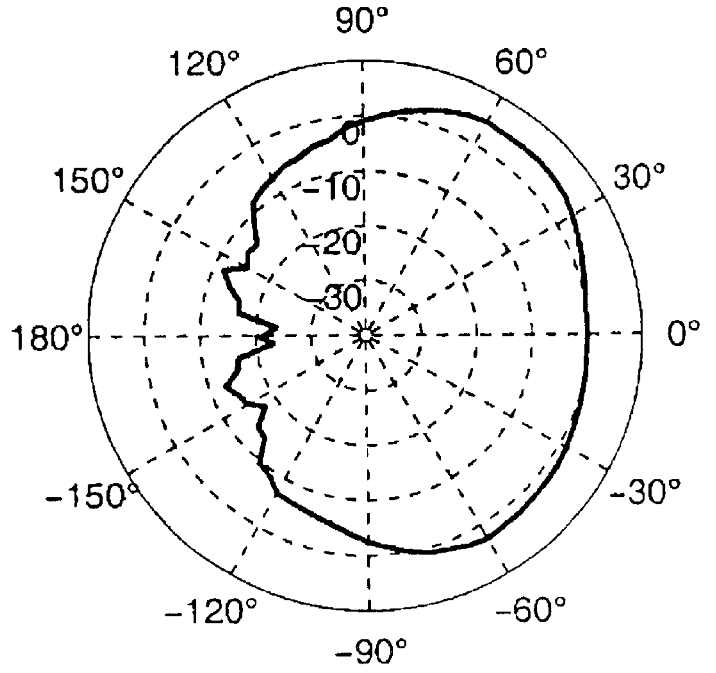
Figure 6A:
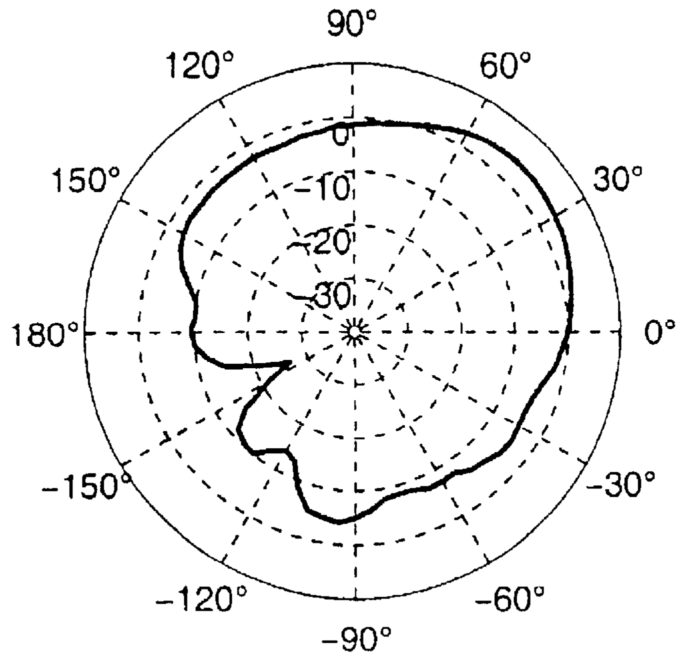
FIGS. 6A through 6D show measured free field vertical directivities at the frequencies 2.5 kHz, 5 kHz, 10 kHz and 20 kHz of a sound reproduction device according to the invention normalized relative to the frontal direction (0 degrees)
Figure 6B:
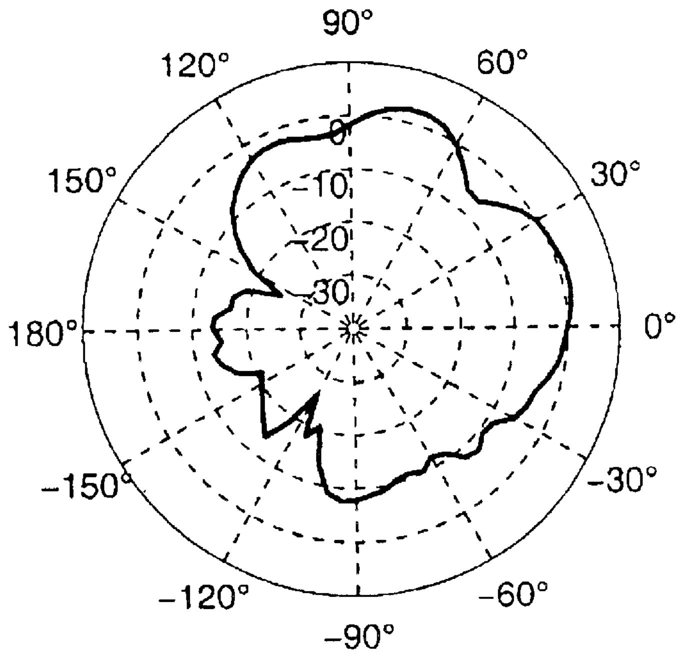
Figure 6C:
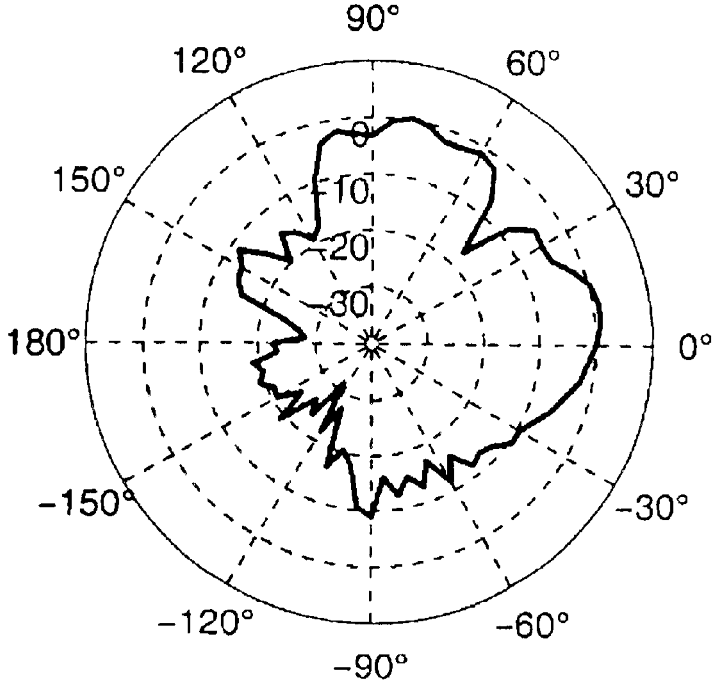
Figure 6D:
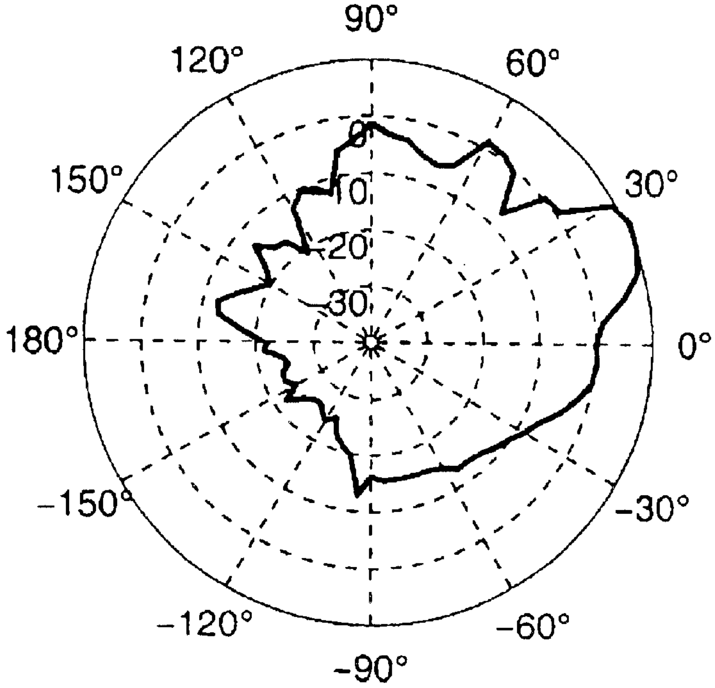

The second baffle means 8, 14 include generally planar front surfaces facing in the X direction in the figure, i.e. the direction towards the desired listening positions or listening area. The location of the front surface of the second baffle means is also shown in FIGS. 3 and 4, and the front surface defines the edge portions of the first reflector surfaces 4, 10 and a part of the edge portions of the second reflector surfaces 5, 11. As shown in FIG. 2 the shape of the second baffles as seen from the direction towards the listening position (along the X axis) is trapezoidal, as indicated by the inclining edge portions 15, 16 in FIG. 2, but other shapes could in principle also be used. Furthermore, although the front surfaces of the second baffle means 8, 14 are planar over the major part of the front surface, it may have a desirable effect on the directional characteristic to provide rounded edge portions 15, 16.

As mentioned above, the dimensions of the various reflector surfaces 4, 10 and 5, 11 respectively and of the first and second baffle means 7, 13 and 8, 14 respectively are preferably chosen according to the specific frequency range of each individual acoustic reflector. Furthermore the ratio between these dimensions could also be optimized for each individual acoustic reflector.

The sound energy to be directed towards the listening positions/listening area is for each of the individual reflectors generated by at least one sound generator means a specific example of such means being indicated by reference numerals 3 and 9 in FIG. 2. Specifically, the generator means as shown in FIG. 2 are dome drivers corresponding for instance to those conventionally used as tweeters (high-frequency radiators) in high-fidelity loudspeaker systems. It is however understood that other types of acoustic generators could also be used, such as cone drivers (for instance electrodynamic), piezo electric drivers or so-called compression drivers, i.e. a driver, where the sound generator g (see FIG. 4) supplies sound energy to the surroundings via an acoustic transmission line, such as a tube r. The possibilities are however by no means limited to the above mentioned types of drivers.

The directional characteristics of the reflector can be affected by the exact positioning of the generator means relative to the various surfaces of the reflector. This is indicated in FIG. 3 (where the generator actually used is the above-mentioned dome driver covering a driver radiation area $A_g$) and in FIG. 4 (where the above-mentioned compression driver is used). In case of the dome driver as shown in FIG. 3, both the direction of radiation (i.e. the orientation of the axis of symmetry through the driver and the dimensions of the reflector), as indicated symbolically in FIG. 3 by the angle $\alpha$ and the position of the driver diaphragm relative to the X, Y and Z dimensions of the reflector, as indicated symbolically by the arrows A and B in FIGS. 3 and 4 are important for the resulting directional characteristics of the reflector. In case of the compression driver as shown in FIG. 4 the dimension represented by the angle $\alpha$ above is irrelevant.

Of course, the exact shape of the reflecting surfaces 4, 10 and 5, 11 plays a major role in attaining the desired directional characteristic. With reference to FIGS. 3 and 4, it has been found, but this is only to be regarded as an example, that in the case of the ellipsoidal surfaces mentioned previously is could be preferable to utilize a portion of a total ellipsoid such that the reflector surface indicated by $S_R$ in these figures extends from a portion of the ellipsoid where the tangent of the ellipsoidal surface is substantially co-parallel with the longitudinal axis (Z) through the reflector and terminates at a portion of said ellipsoid where the tangent of the ellipsoidal surface is substantially normal to the longitudinal axis (Z).

As mentioned initially, not only will the directional characteristics be determined by the geometry of the various surfaces of the reflectors but also by variations of the acoustical (reflective) properties of these surfaces or chosen portions of these surfaces. It is hence possible to adjust the directional characteristics of the reflectors by providing either the total surface of the reflector surfaces 4, 10 and 5, 11 respectively and/or the first and second baffle means 7, 13 and 8, 14 respectively or chosen portions hereof with a suitable surface texture. It would also be possible to introduce acoustically absorbing portions of the various surfaces for instance by providing patterns of apertures or slits through the surface and terminating with an acoustic absorbing material such as felt or mineral wool in a manner, that is well known within the art. Also portions of the reflector surfaces may be provided by diffusor means, for instance in the shape of protrusions or other irregularities on the surfaces.

Referring now to FIGS. 5A through 6D there are shown free field measurements of horizontal and vertical directivities at the frequencies 2.5 kHz, 5 kHz, 10 kHz and 20 kHz obtained with a reproduction device of the kind described above. For comparison the measured free field directivity at 20 kHz for the same treble dome driver unit used as sound generator as in the device according to the invention but conventionally vertically mounted in a 17 cm wide cabinet is shown in FIG. 7.

Specifically, it is apparent from FIGS. 5A through 5D that the horizontal directivity of the reproduction device according to the invention is fairly constant throughout the frequency range from 2.5 kHz to 20 kHz. Sound energy is—as desired—predominantly radiated towards the frontal portion of the horizontal plane, the directivity pattern is between a few dB and some 10 dB down at +/−90 degrees and heavily attenuated in the rear portion of the horizontal plane. The latter is as mentioned initially desirable in order to attenuate reflection from a wall or other obstacle present behind the device, which reflections will give rise to interaural differences close to zero. The fairly even distribution of sound energy throughout the frontal part of the horizontal plane at all measured frequencies is as mentioned initially desirable in order to obtain a uniform timbre over the entire area in front of the reproduction device.

Figure 7:
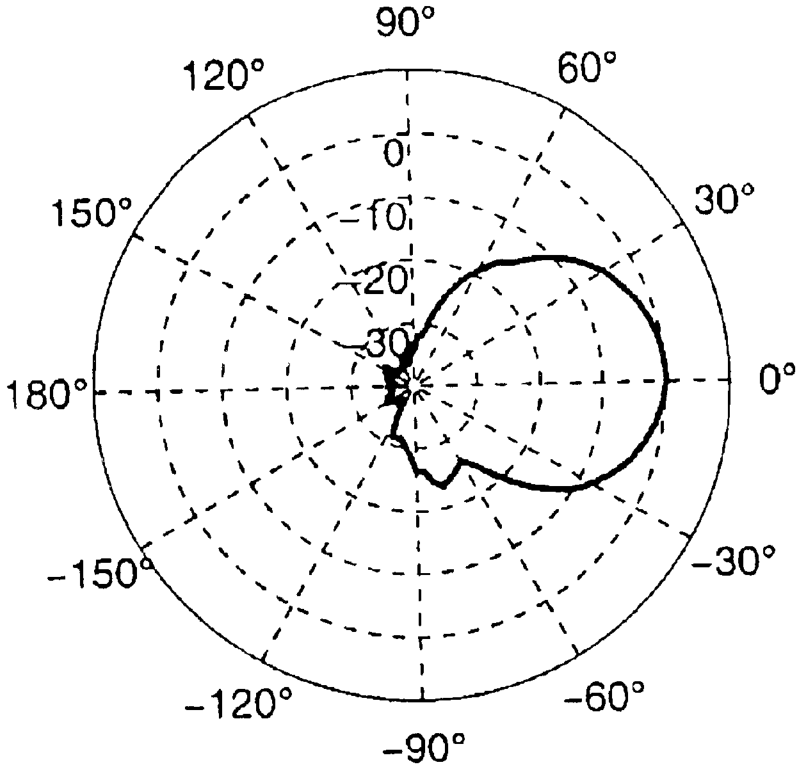
FIG. 7 shows measured free field horizontal directivity at 20 kHz for the treble dome driver used in the sound reproduction device according to the invention but with the driver conventionally mounted vertically in a 17 cm wide cabinet.

The horizontal directivity pattern obtained with the device according to the invention at the frequency 20 kHz can be compared with the corresponding horizontal directivity pattern shown in FIG. 7. It is immediately apparent that a much more uniform horizontal directionality is obtained at high frequencies with the device according to the invention than with a conventionally mounted dome tweeter.

Referring now to FIGS. 6A through 6D, there is shown corresponding measured free field directivities of the device according to the invention in the vertical plane measured at the frequencies 2.5 kHz, 5 kHz, 10 kHz and 20 kHz. As stated initially it is generally desirable to attenuate reflections from the floor and ceiling between the sound source and the listening position as well as from a wall or other obstacle located behind the sound source. In a normal listening room, the reflections from the floor and ceiling will typically correspond to elevation intervals of between +/−30 to 60 degrees, and these reflections will arrive at the ears of a listener with approximately the same interaural differences (time and/or intensity) as the direct sound, thereby possibly leading to undesired comb-filter effects. It is hence desirable to attenuate the radiation of sound energy within these vertical intervals (as well as the radiation of sound energy in the backward direction). It is apparent from FIGS. 6A through 6D that the device according to the invention provides attenuation of radiated sound energy both in the direction towards the floor (−30 to −60 degrees) and in the backward direction. Attenuation of radiated sound energy in the elevation interval +30 to +60 degrees is especially apparent at frequencies from 5 kHz upwards, although it is not so pronounced as the attenuation of radiation towards the floor and backwards.

Although the invention has been described in detail herein, it should be understood that the invention is not limited to the embodiments herein disclosed. Further, various changes, substitutions and modifications may be made to the disclosure by those skilled in the art without departing from the spirit or scope of the invention as described and defined by the appended claims.

What is claimed is:

1. A sound reproduction device for delivering sound energy from one or more generators to a listening position/listening area comprising:

means for directing a portion of said sound energy from said one or more generators to said listening position/listening area, where said means are adapted for minimizing the reflected sound from each of one or more surfaces that results in essentially the same interaural difference of the reflected sound and of the sound received directly from said means for directing sound at said listening position/listening area, whereby undesired reflections of sound will be minimized at said listening position/listening area.

2. A sound reproduction device according to claim 1 wherein said means for direction of sound energy comprises one or more acoustic reflectors inserted in the sound propagation path between each of said generators and said listening position/listening area.

3. A sound reproduction device according to claim 2 wherein each of said acoustic reflectors comprises at least a first and a second reflector surface for changing the direction of propagation of sound waves provided by said generators.

4. A sound reproduction device according to claim 3 wherein said acoustic reflectors furthermore comprises one or more baffle means for acoustic interaction with said reflector surfaces, which interaction affects the overall radiation pattern of the specific acoustic reflector.

5. A sound reproduction device according to claim 3 wherein said reflector surfaces are curved.

6. A sound reproduction device according to claim 4 wherein said baffle means comprise one or more curved surfaces.

7. A sound reproduction device according to claim 4 wherein the dimensions of said reflector surfaces and the dimensions of said baffle means are chosen in relationship with the specific frequency range/range of wavelengths each of said acoustic reflectors and associated generator is adapted to radiate.

8. A sound reproduction device according to claim 4 wherein for each of said acoustic reflectors the ratio between the dimensions of said reflector surfaces and the dimensions of each of said baffle means are chosen within predetermined ranges.

9. A sound reproduction device according to claim 2 wherein the orientation (α, A, B) of said generator relative to said reflector surface and its area of radiation ($A_g$) can be varied.

10. A sound reproduction device according to claim 2 wherein said generator is coupled to the sound wave propagation path to said reflector surface by means of an acoustic transmission line (r) terminating in an opening for acoustic radiation towards said reflector surface such that the position of said opening relative to said reflector surface can be varied.

11. A sound reproduction device according to claim 2 wherein said generators are chosen from the group comprising dynamic dome drivers, dynamic cone drivers and piezo electric drivers.

12. A sound reproduction device according to claim 5 wherein said reflector surfaces are ellipsoidal.

13. A sound reproduction device according to claim 12 wherein the reflector surface extends from a portion of said ellipsoid where the tangent of the ellipsoidal surface is substantially co-parallel with the longitudinal axis (Z) through the acoustic reflector and terminates at a portion of said ellipsoid where the tangent of the ellipsoidal surface is substantially normal to said longitudinal axis (Z).

14. A sound reproduction device according to claim 4 wherein each of said one or more baffle means comprises a first baffle portion extending substantially normal to the longitudinal axis (Z) of the acoustic reflector at the end of said first reflector surface facing away from said second reflector surface.

15. A sound reproduction device according to claim 4 wherein each of said one or more baffle means comprises a second baffle portion extending substantially parallel to the longitudinal axis (Z) of the acoustic reflector and located in said acoustic reflector opposite the direction from the acoustic reflector towards said listening position/listening area.

16. A sound reproduction device according to claim 15 wherein the longitudinally extending outer edges of said second baffle portions are rounded.

17. A sound reproduction device according to claim 4 wherein at least predefined portions of said reflector surfaces and said baffle means are provided with suitable surface texture, whereby the acoustic radiation pattern of each of said acoustic reflectors can be affected.

18. A sound reproduction device according to claim 4 wherein at least predefined portions of said reflector surfaces and said baffle means are provided with acoustic absorbers, whereby the acoustic radiation pattern of each of said acoustic reflectors can be affected.

19. A sound reproduction device according to claim 4 wherein at least predefined portions of said reflector surfaces and said baffle means are provided with acoustic diffusers, whereby the acoustic radiation pattern of each of said acoustic reflectors can be affected.

20. A sound reproduction device for directing sound energy from at least one acoustic generator to a listener, comprising:

at least one acoustic reflecting surface for receiving and reflecting sound energy from the at least one acoustic generator; and at least one baffle for controllably modifying the directional characteristics of the sound energy from the at least one acoustic generator, the at least one acoustic reflecting surface and the at least one baffle together minimizing reflected sound energy that results in essentially the same interaural difference of the reflected sound energy and of the sound energy transmitted directly between the at least one acoustic generator and the listener.

21. A sound reproduction device as recited in claim 20, said at least one acoustic reflecting surface comprises a first set of reflecting surfaces and a second set of reflecting surfaces.

22. A sound reproduction device as recited in claim 21, said at least one baffle comprises a first baffle and a second baffle.

23. A sound reproduction device as recited in claim 22, said first set of reflecting surfaces and said first baffle handle a first frequency range from a first one of the at least one acoustic generators, and the second set of reflecting surfaces and said second baffle handle a second frequency range from a second one of the at least one acoustic generators, the first and second frequency ranges being different.

* * * * *